United States Patent [19]

Maskens et al.

[11] Patent Number: 5,123,154
[45] Date of Patent: Jun. 23, 1992

[54] PRINTED CIRCUIT BOARD ASSEMBLY APPARATUS

[75] Inventors: Geoffrey D. Maskens, Wimborne; Brian Doe, Blandford Forum, both of United Kingdom

[73] Assignee: Blakell Systems Limited, England

[21] Appl. No.: 716,939

[22] Filed: Jun. 18, 1991

Related U.S. Application Data

[62] Division of Ser. No. 602,724, Oct. 24, 1990, Pat. No. 5,044,062.

[51] Int. Cl.⁵ ............................................. H05K 3/30
[52] U.S. Cl. .................................... 29/564.8; 29/741; 140/105
[58] Field of Search ............... 29/564.6, 564.7, 564.8, 29/566.3, 721, 739, 741, 33 M, 566.1; 140/105, 139; 83/579, 580, 500

[56] References Cited

U.S. PATENT DOCUMENTS

| | | | |
|---|---|---|---|
| 4,054,988 | 10/1977 | Masuzima et al. | 29/564.6 |
| 4,153,082 | 5/1979 | Foley | 29/741 X |
| 4,574,462 | 3/1986 | Jackson | 29/566.3 |
| 4,586,544 | 5/1986 | Yagi et al. | 140/105 |

FOREIGN PATENT DOCUMENTS

2808343 9/1978 Fed. Rep. of Germany ........ 29/741

*Primary Examiner*—William Briggs
*Attorney, Agent, or Firm*—Klarquist, Sparkman, Campbell, Leigh & Whinston

[57] ABSTRACT

Printed circuit board assembly apparatus comprises means for supporting a printed circuit board for assembly of components on one side of the board by inserting leads of the components into corresponding holes formed in the circuit board at predetermined locations, light projecting means for illuminating from the one side of the board the holes intended to receive the leads of a selected component and cutting means for cropping and crimping the leads of the component projecting from the other side of the board after assembly of the component on the board, the cutting means being actuatable by a chute means for collecting the ends of the leads severed by the cutting means.

2 Claims, 6 Drawing Sheets

To align both cutters with both holes corrections will be necessary in X, Y, θ and pitch.

Fig. 3.

Fig. 4a. Zero error

Fig. 4b. +X error

Fig. 4c. +Y error

Fig. 4d. +X, +Y error

PRINTED CIRCUIT BOARD ASSEMBLY APPARATUS

This is a division, of application Ser. No. 07/602,724, filed Oct. 24, 1990, U.S. Pat. No. 5,044,062.

BACKGROUND OF THE INVENTION

THIS INVENTION relates to improvements in or relating to apparatus for use in assembling electrical components on printed circuit boards.

A known form of apparatus used in the assembly of electronic components on printed circuit boards comprises an inclined working frame which is conveniently arranged for a seated operative, and on which the printed circuit board is secured. The printed circuit board has pre-drilled holes at predetermined locations for receiving the leads of corresponding components. An optical projector is mounted above the working surface and is controlled by a micro-computer in accordance with a predetermined program to project light spots onto the printed circuit board to indicate to an operator, in sequence, the positions at which the various components are to be assembled on the board. Means may also be provided to indicate the identity of the component to be assembled at that location.

In use of such apparatus, the leads of the selected component are inserted by the operator into the holes indicated by the projector and the projector program is then stepped to the next position. This sequence of operations is repeated until all the required components have been assembled on the board.

It is then necessary to cut short the projecting leads on the undersurface of the board. This can be done by cropping and bending (clinching) each lead individually, thereby securing the assembled components to the board. Alternatively, all of the assembled components to be cut may be held in position on the board by means of a resilient pad applied to the upper surface of the board, while all the leads are cropped in one sweep by single wide cutting blade. In the latter case, because the leads are not clinched, it is then necessary to use some other means (commonly a shrink wrap foil) to secure the assembled components while the board is soldered, commonly on a wave soldering machine.

In practice, the individual lead cropping and clinching approach is time-consuming compared to the time required to assemble the components on the board, while the single wide cutting blade approach requires some additional means of securing the components prior to soldering and presents significant manufacturing difficulties.

Figure 2:
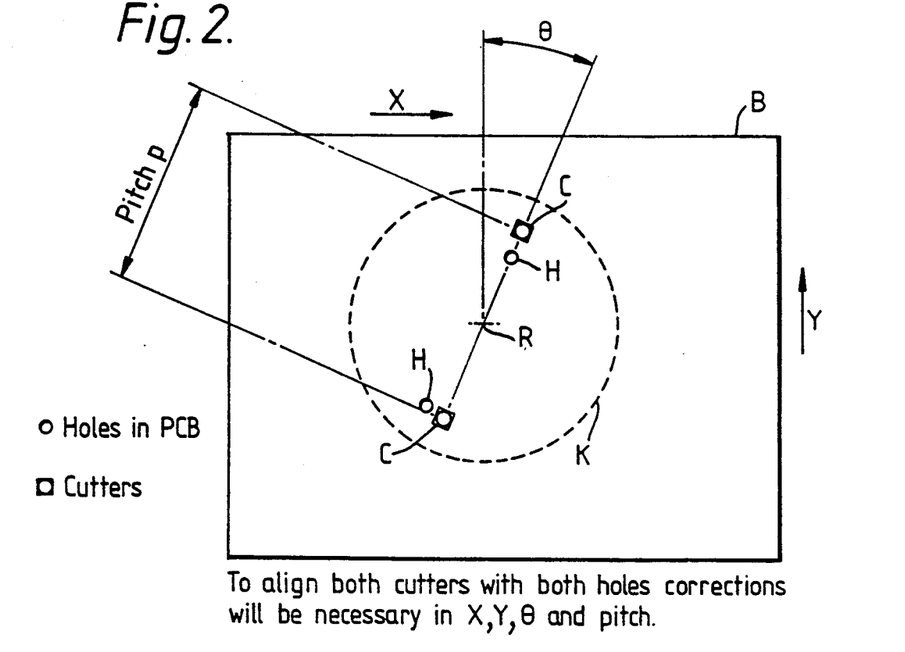
FIG. 2 is a diagram illustrating the programmed movements necessary in order to align two component lead cutters carried on a rotatable carrier with respective holes in a printed circuit board.

Because of the foregoing disadvantages, a variant of the optically assisted assembly apparatus has been developed in which the printed circuit board (B) is movable with the working frame in mutually perpendicular X and Y directions under program control as illustrated in FIG. 2 of the accompanying drawings. Two cutters (C) are mounted symmetrically under the printed circuit board on a carrier (K) which is vertically movable through a short (typically 5 mm) distance and which is also rotatable about a fixed vertical reference axis (R). In use, the circuit board is positioned so that the reference axis coincides substantially with the centre of the component to be inserted, that is coincides with the mid-point between the corresponding printed circuit board holes (H). The distance (pitch p) between the cutters can then be adjusted and the carrier rotated ($\theta$) about the reference axis under program control so that nips of the cutters are aligned with the printed circuit board holes. After alignment, the cutter assembly is raised to bring the cutters into contact with the underside of the printed circuit board.

As the component leads are inserted in the corresponding printed circuit board holes, the leads also enter the nips of the gutters positioned beneath the printed circuit board holes. On command, the cutters operate and crop the leads of the component to the required length and also clinch the cropped leads to secure the component to the board. This process is repeated in turn with each component. Thus, at the completion of the assembly operation, the board is immediately ready for flow-soldering without any possibility of components becoming detached from the board.

Figure 3:
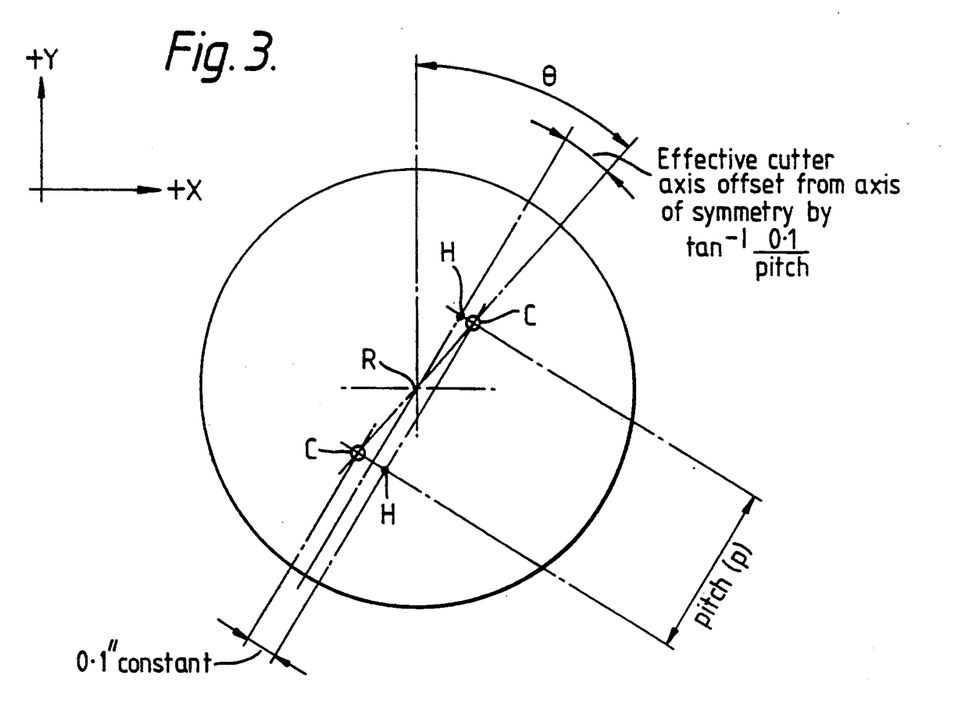
FIG. 3 illustrates geometrical the arrangement of two component lead cutters which are able to pass at the centre of rotation of the carrier.

In the known apparatus provided with such programmed cutters, in order to accommodate very short component pitches, it is necessary to arrange the cutters so that they can pass each other at the centre of rotation defined by the reference axis. Because the minimum pitch required can be as small as 0.100 inches (2.54 mm), it can be seen that each cutter must protrude somewhat less than 0.050 inches (1.27 mm) beyond the centre-line of the component lead involved. As illustrated in FIG. 3 of the accompanying drawings, such an arrangement implies that the line (cutter axis) joining the centres of the nips of the two cutters (C) is not parallel with the line (hole axis) joining the centres of the two printed circuit board holes (H) and variable adjustment of the cutter assembly about the vertical reference axis (R) is required to compensate for this and bring the cutters into alignment with the printed circuit board holes. In effect, as shown on FIG. 3, the cutter axis is angularly offset from the hole axis by the variable angle $$\tan^{-1} \frac{2.54}{\text{pitch}}$$

where the pitch is measured in mms.

With these constraints, a difficulty arises as regards the size of the cutters. Thus, the cutters must be small enough to fit between the leads of adjacent components which have already been assembled, so that the design of the printed circuit board is not constrained by the limitations of the assembly machine and, at the same time, the cutters must be strong enough (therefore large enough) to withstand the cutting loads encountered, which may be considerable when cutting maximum diameter copper leads or leads made of harder materials.

It is found that, in order to provide sufficiently strong cutters and to reduce the interference between cutters and component leads already assembled, it is necessary to minimise all the working clearances and this implies that the cutters must be accurately aligned with the corresponding holes by the programmed movements of the board and cutters in order to permit entry of the component leads.

The accuracy of the programmed alignment is a function, inter alia, of the accuracy of the following factors in the apparatus:

a) The X and Y position including the precision of the drive means and the straightness and perpendicularity of the guide means involved in positioning the circuit board.

b) The distance between the cutters c) The angle of the line joining the cutters with respect to X and Y.

With these factors alone, the required accuracy will only allow errors in each element in the region of 0.025 mm, which is expensive to achieve.

In addition, there are sometimes significant errors in the drilling of the component holes in the printed circuit board. Such errors may not be consistent between nominally identical boards and cannot therefore be effectively compensated by adjustments to the programme.

Accumulation of these errors, possibly compounded by long term drift, sometimes makes it difficult for the operator to insert the leads through the cutters and can involve time consuming individual adjustment of the alignment of the cutters using manual joystick control.

In addition, the machine may require recalibration at intervals in order to maintain sufficient accuracy.

SUMMARY OF THE INVENTION

It is an object of the present invention to provide a printed circuit board assembly apparatus which enables the cutters of the apparatus to be positioned reliably in alignment with respective component holes in the circuit board.

Accordingly, in one aspect, the present invention provides printed circuit board assembly apparatus comprising means for supporting a printed circuit board for assembly of components on one side of the board by inserting leads of the components into corresponding holes formed in the circuit board at predetermined locations, light projecting means for illuminating from the one side of the board the holes intended to receive the leads of a selected component and cutting means for cropping and crimping a lead of the component projecting from the other side of the board after assembly of the component on the board, the cutting means comprising a cutter having a nip to be aligned with a corresponding hole in the board prior to the insertion of a corresponding component lead, in which apparatus the cutter comprises an optical sensing arrangement disposed at a predetermined spacing in a predetermined direction from the nip of the cutter, and control means are provided for first aligning the optical sensing arrangement with a hole in the board with which the nip of the cutter is to be aligned and then displacing the cutter in the said predetermined direction by the predetermined spacing to bring the nip of the cutter into alignment with the hole in the board.

The invention also provides printed circuit board assembly apparatus comprising means for supporting a printed circuit board for assembly of components on one side of the board by inserting leads of the components into corresponding holes formed in the circuit board at predetermined locations, light projecting means for illuminating from the one side of the board the holes intended to receive the leads of a selected component and cutting means for cropping and crimping the leads of the component projecting from the other side of the board after assembly of the component on the board, the cutting means comprising a pair of cutters mounted on a rotatable carrier for linear movement in a pitch direction and each having a nip to be aligned with a corresponding hole in the board prior to the insertion of a corresponding component lead, in which apparatus each of the cutters comprises an optical sensing arrangement disposed at a predetermined spacing from the nip of the cutter in the pitch direction for sensing light transmitted through a hole in the board with which the nip of the corresponding cutter is to be aligned, and control means are provided for first aligning the optical sensing arrangements with a pair of holes with which the nips of the cutters are to be aligned and then displacing the cutters by the predetermined spacing in the pitch direction to bring the nip of each cutter assembly into alignment with the respective hole in the board.

In the known printed circuit board assembly apparatus described above, the length of the component lead projecting from the lower surface of the printed circuit board after cutting is commonly controlled by means of a rigid vertical locating pin fixedly mounted adjacent each cutter, so that the vertical distance between the underside of the printed circuit board and the cutter is determined when the upper extremity of the locating pin is engaged by the lower surface of the printed circuit board. In practice, after the circuit board has reached the next insertion position, the operator presses the board down to make contact with the pins before initiating the cutting cycle. The height may be varied by selecting and fitting suitable locating pins at the start of an assembly job.

It will be appreciated that, when the board is pressed down to make contact with the pin, there is a possibility that the pin may be driven into forcible contact with the lead of a component already in position. Under some circumstances, this may result in a false height being set or, if the pin is displaced laterally by the resulting force, may cause fracture of the necessarily slender pin.

It is another object of the present invention to provide a printed circuit board assembly apparatus in which the length of the trimmed component leads may be reliably set.

Accordingly, in another aspect of the invention, there is provided printed circuit board assembly apparatus comprising means for supporting a printed circuit board for assembly of components on one side of the board by inserting leads of the components into corresponding holes formed in the circuit board at predetermined locations, cutting means for cropping and crimping the leads of a component projecting from the other side of the board after assembly of the component on the board and means for positioning the board in a cropping position relative to the cutting means prior to actuation of the cutting means, the cutting means comprising locating pin means projecting from the cutting means for engaging the said other side of the board in the cropping position to determine the length of the cropped leads, in which apparatus the locating pin means comprises a locating pin pivotally mounted on the cutting means and resiliently biased into a normal position from which it is pivotally displaceable against the resilient bias by an obstacle on the said other surface of the board so as to engage the surface of the board.

In use of the known printed circuit board assembly apparatus described above, it is important that the severed ends of the component leads are removed from the cutting area without any possibility of jamming in the mechanism. This is achieved using a downwardly tapering scrap chute, the wider upper end of which is located directly beneath the cutters and the narrow lower end conducting the severed ends of the leads out of the bottom of the mechanism. This chute merely serves the purpose of removing the severed ends of the leads and a separate drive mechanism is provided for actuating the cutters.

A further object of the present invention is to simplify this actuation of the cutters.

Accordingly, in a third aspect, the invention provides printed circuit board assembly apparatus comprising means for supporting a printed circuit board for assembly of components on one side of the board by inserting leads of the components into corresponding holes formed in the circuit board at predetermined locations, cutting means for cropping and crimping the leads of a component projecting from the other side of the board after assembly of the component on the board and chute means for collecting the ends of the leads severed by the cutting means, in which apparatus the chute means is movable relative to the cutter means to actuate the cutting means to crop and crimp the component leads.

BRIEF DESCRIPTION OF THE DRAWINGS

In order that the invention may be more readily understood, an embodiment thereof will now be described with reference to the accompanying drawings, in which.

DESCRIPTION OF PREFERRED EMBODIMENTS

Figure 1:
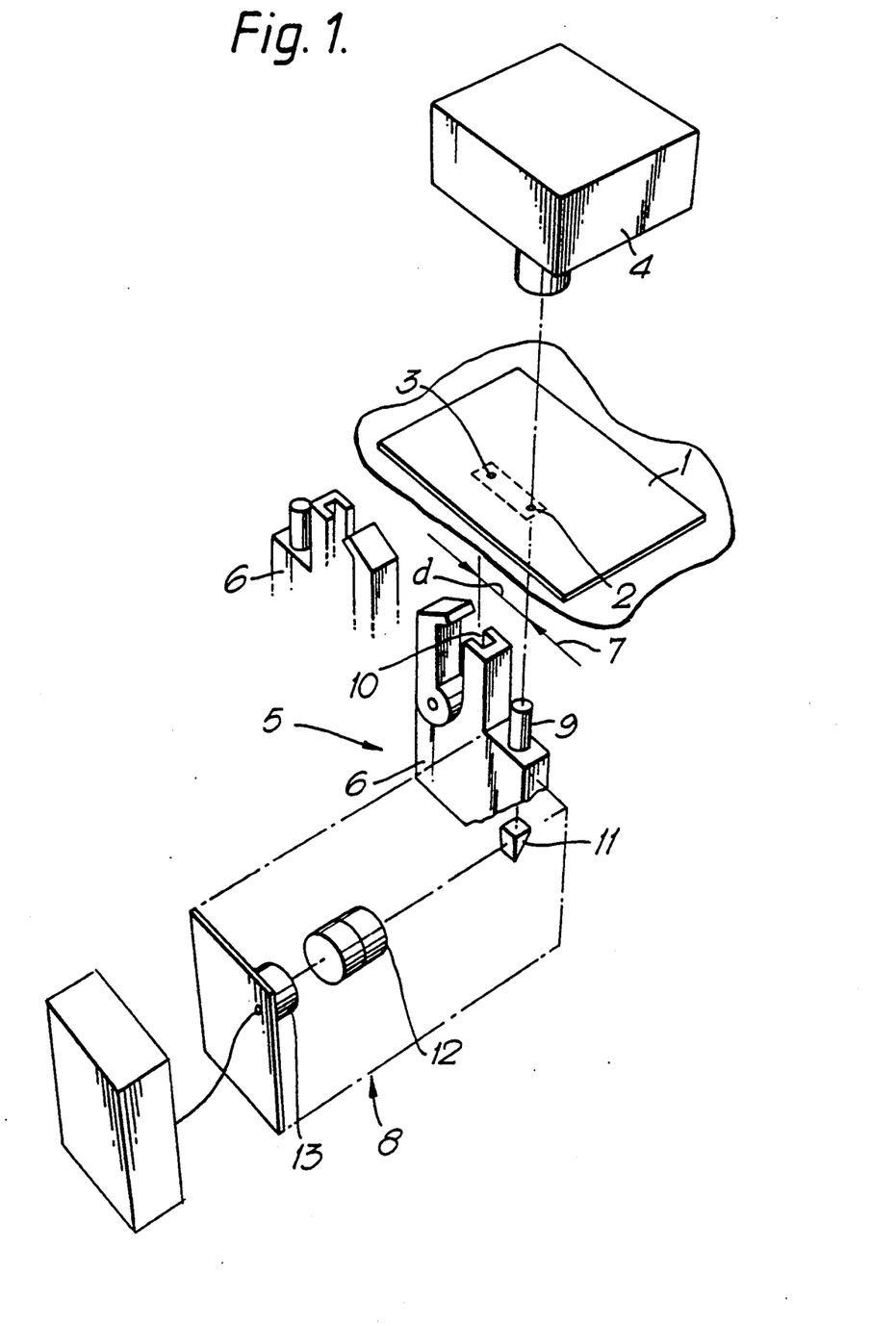
FIG. 1 is a schematic diagram illustrating the operating principle of a printed circuit board assembly apparatus embodying the present invention.

Referring firstly to FIG. 1, a printed circuit board 1 is supported by a working frame 16 in a working position for the assembly of electronic components on the upper surface of the board by insertion of the leads of each component into a pair of corresponding pre-drilled holes 2 and 3 in the circuit board, so that the component leads project from a lower surface of the board.

An optical projector 4 is arranged to project, in accordance with a predetermined program, a spot of light onto each of the pair of holes 2 and 3 corresponding to the component to be assembled on the board.

Cutting and clinching means 5 is disposed beneath the circuit board 1 and comprises a pair of cutters 6 each for positioning beneath a respective one of the holes 2 and 3 for cropping an end portion of a component lead projecting through the respective hole and clinching the remainder of the lead to secure the component to the board during a subsequent soldering operation. The cutters 6 are mounted on a rotatable carrier (not shown) and are linearly movable towards and away from one another in a pitch direction 7. The cutters are offset from one another transversely of the pitch direction so that the cutters are movable past one another in the pitch direction.

An optical position sensing system 8 is associated with, and movable with, each of the cutters 6 and serves to detect the spot of light projected through the respective component hole 2, 3 in the board 1. Each optical system 8 has an inlet aperture 9 defining a vertical optical axis located at a predetermined offset d in the pitch direction from a nip 10 of the cutter. Reflecting means in the form of a mirror or prism 11 deflects the light beam admitted by inlet aperture 9 through 90°, to a lens 12 for focussing the deflected beam onto a light detector 13 which delivers output control signals to a microcomputer 17.

The light detector 13 is a monolithic quadrant silicon photodiode, such as the device made and sold by Integrated Photomatrix Limited as device IPL 10130. As illustrated in FIG. 4, such a device has a circular light sensitive area divided into four quadrants constituting a pair of opposed X quadrants 14A, 14B and a pair of opposed Y quadrants 14C and 14D. The quadrants are electrically connected together to provide a first X error output signal which is significant of any difference between the illumination of quadrants 14A and 14B and a second Y error output signal which is significant of any difference in the illumination of quadrants 14C and 14D.

Figure 4A:
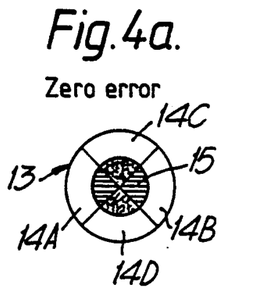
FIG. 4a–4d show an optical detector employed in the apparatus embodying the invention under four different conditions of illumination by a light spot.
Figure 4B:
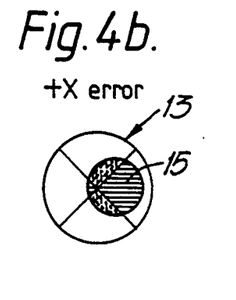
Figure 4C:
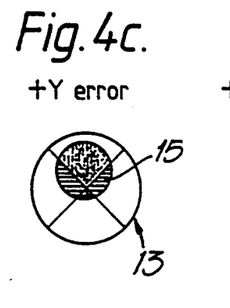
Figure 4D:
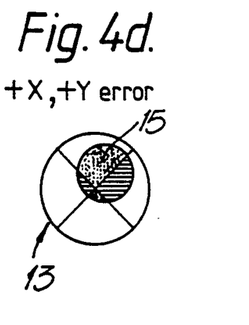

FIG. 4a shows a light spot 15 imaged centrally on the detector 13, indicating alignment of the optical axis of the position sensing system 8 with the corresponding hole in the printed circuit board. In this condition, the detector produces no output signal. FIG. 4b shows the position of the light spot 15 on the detector when there is an X error in the alignment of the position sensing system 8 and the corresponding hole, while 4c shows a position of the light spot when there is a Y error in the alignment and FIG. 4d shows a position of the light spot when there are both X and Y errors in the alignment. Any output error signals from the detector 13 serve as control signals which are fed to the microcomputer 17 and are used to make automatic adjustments to the position of the circuit board, the rotatable carrier and the cutters to achieve the zero error position of FIG. 4a, at which time both of the optical position sensing systems are truly aligned with the component holes, regardless of minor machine or printed circuit board errors or drift. Finally, the cutters themselves are accurately brought into alignment with the holes 2 and 3 by simply displacing the cutters by the fixed distance d in the pitch direction so that they replace the optical position sensing system. The component leads can then be inserted into the holes 2, 3 and into the nips 10 of the underlying cutters 6 and the projecting leads cropped and clinched by closing operation of the cutters 6.

FIGS. 5 to 10 illustrate in more detail the cutter assembly of an apparatus embodying the invention. Referring to these Figures, a cutter carrying disc 21 is attached to a bottom plate 23 by side plates 22. The bottom plate 23 is supported by a ball journal 24 on a frame 25 which also supports the disc 21 in a roller bearing (not shown), so that the carrier disc 21 is mounted for rotation about a vertical reference axis (R). Elevating means (not shown) are provided for raising the frame 25 by a short distance, typically 5 mm, towards a printed circuit board 20 supported above the disc 21 in a working position.

Figure 5:
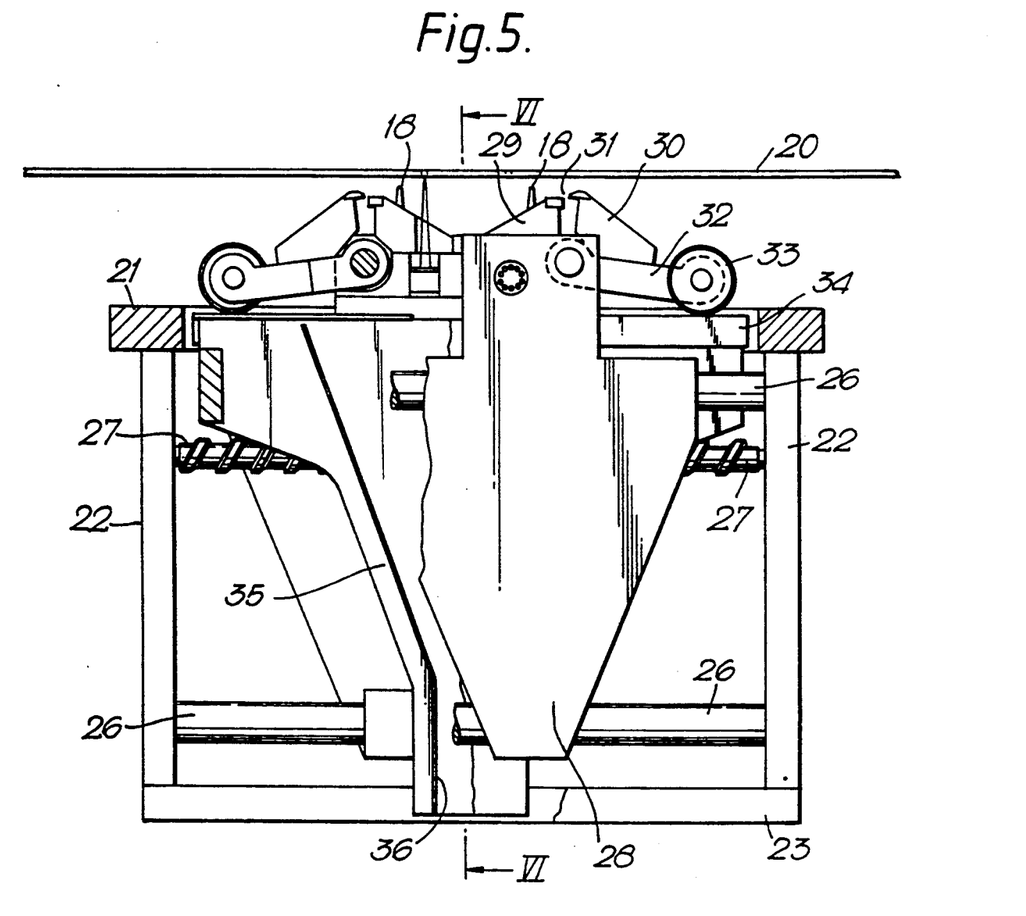
FIG. 5 is a partially sectioned side elevation of the main elements of a printed circuit board assembly apparatus embodying the present invention.
Figure 6:
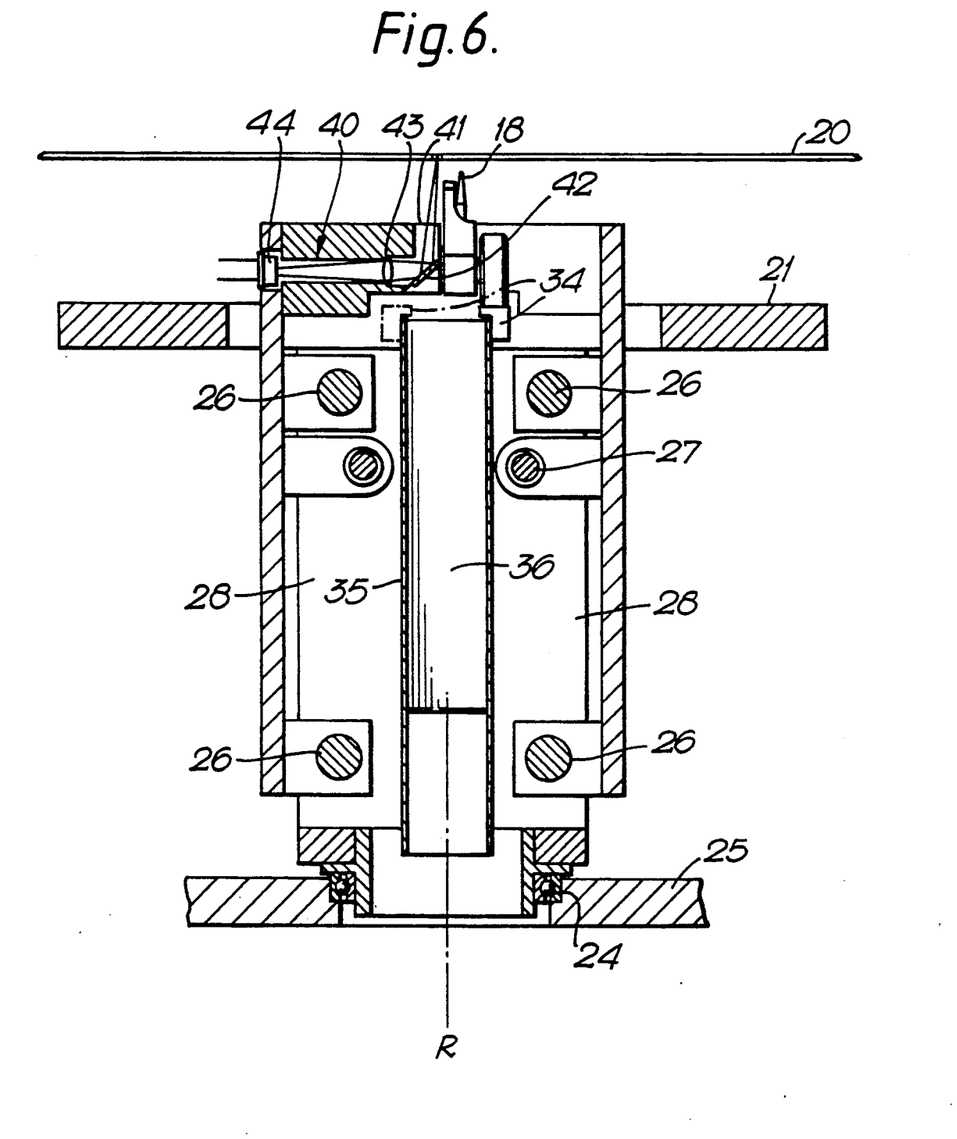
FIG. 6 is a cross-sectional view taken through the apparatus of FIG. 5 on the line VI—VI of FIG. 5.
Figure 7:
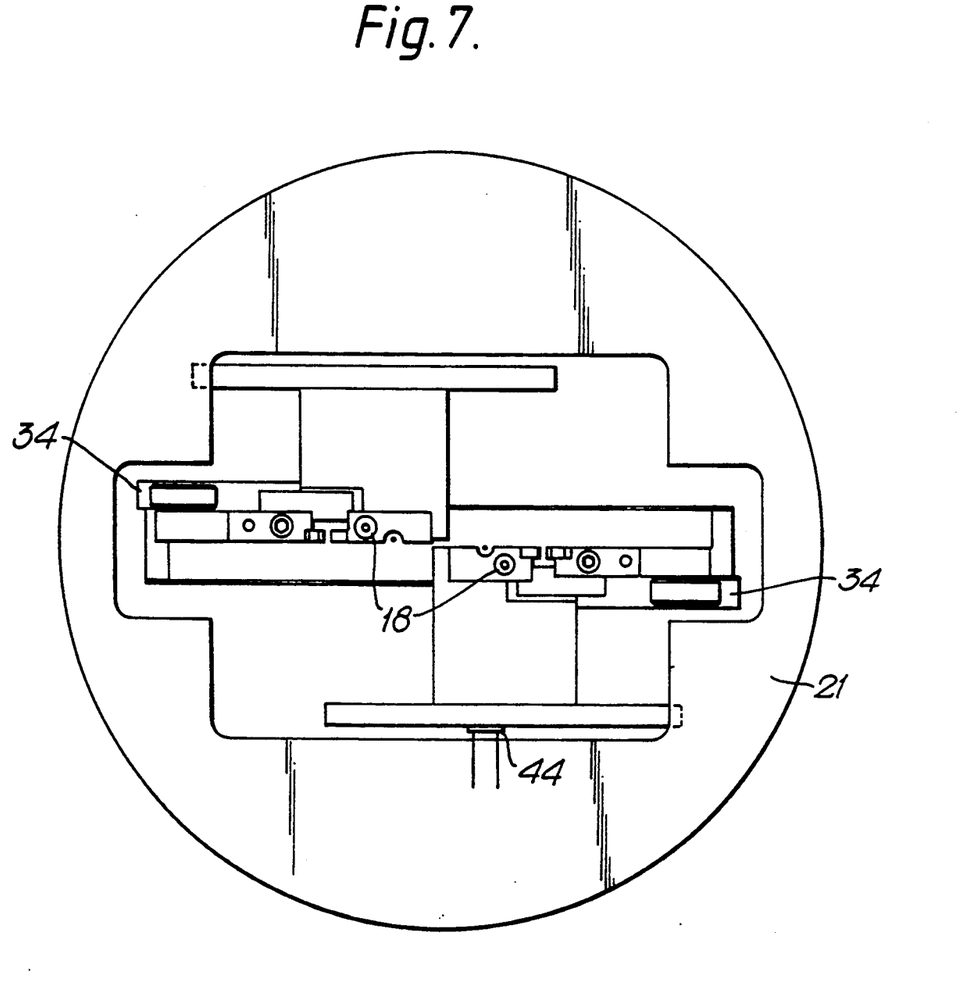
FIG. 7 is a plan view of the apparatus.

The side plates 22 carry guide rods 26 and lead screws 27 which support and position two identical cutters 28 symmetrically disposed above the axis of rotation. Each lead screw 27 is rotatable by an electrical motor drive (not shown) to displace the associated cutter 28 linearly in a pitch direction in accordance with a control signal applied to the drive. Each cutter 28 has a fixed jaw 29 and a movable jaw 30 defining therebetween a nip 31, the movable jaw 30 being mounted on an operating lever 32 pivotally mounted on the cutter 28 and actuated by a roller 33.

Figure 8:
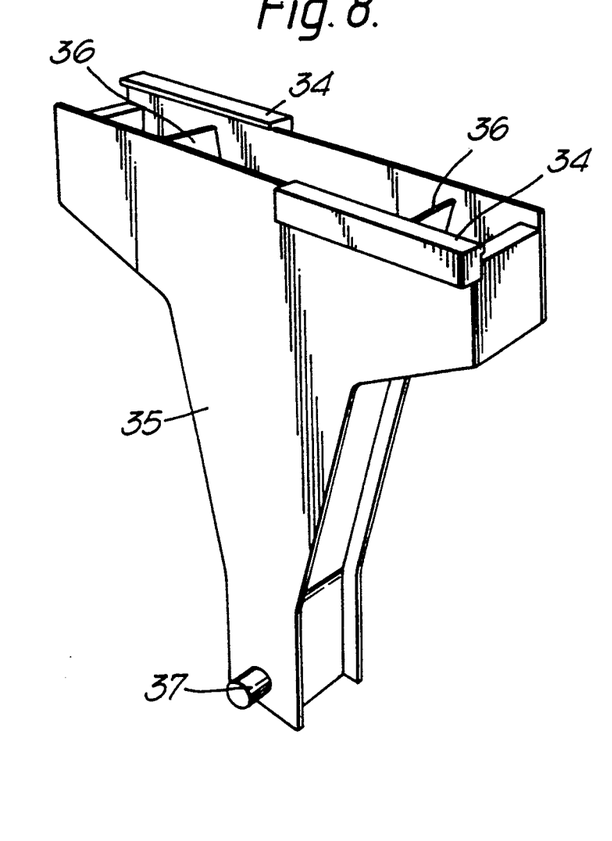
FIG. 8 is a perspective of a scrap chute of the apparatus.

Each of the rollers 32 runs on a respective rail 34 which is attached to the upper extremity of a scrap chute 35 which has inclined inner walls 36 and lifting spigots 37. The chute 35 is constrained to move in a vertical direction only by suitable means (not shown).

Each cutter 28 comprises, as shown more particularly in FIG. 6, an optical position sensing arrangement 40 comprising a slot 41 defining an inlet aperture with an optical axis located from the centre of the associated cutter nip. A mirror 42 is disposed at a predetermined spacing d in the pitch direction at the bottom of the slot 41 and directs the light emerging from the hole in the printed circuit board to a lens 43 which focusses the image of the illustrated hole onto an optical detector 44 of the kind already described with reference to FIG. 4. Misalignment between the programmed position to which the printed circuit board hole is moved and the optical axis of the position sensing arrangement causes an identical displacement of the spot of illumination falling on the detector 44, resulting in an output electrical error signal from the sensor which is fed to the micro-computer 16 which, depending upon the error signal generated, acts to adjust the X, Y position of the board, the rotational position of the disc 21 and the linear position of the cutters 28 to align the optical axis of each position sensing system with the centre of the respective hole in the printed circuit board. Once this has been achieved, each cutter 28 is simply and accurately positioned beneath the hole in the printed circuit board by automatically linearly displacing the cutter block by the predetermined spacing d under the control of the computer.

The cutter assembly is then elevated and the leads of a component may be inserted into the holes in the circuit board 20 so that the leads project beneath the board into the nips of the aligned cutters 28. The board 20 is then pressed down into engagement with locating pins 18 which are mounted on the cutters 28 and define a predetermined spacing between the bottom of the board and the cutter jaws, so as to determine the length of the component leads after cropping by the cutter assembly. The cutters 28 are then operated to carry out the cropping and clinching action by urging the chute 35 upwardly by means of a drive mechanism (not shown) acting on the spigots 37. This upward motion of the chute 35 causes the levers 32 to pivot upwardly, regardless of the position of the cutters with respect to the axis of rotation, and accordingly closes the movable jaw 30 of the cutter device against the fixed jaw 29 to crop and clinch the component lead. Means (not shown) are also provided to ensure that downward movement of the chute 35 results in re-opening of the cutter jaws 29, 30.

Figure 9:
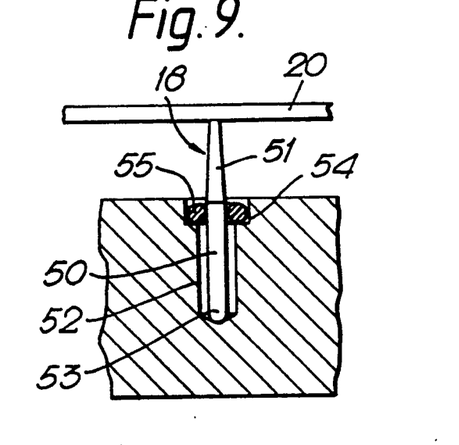
FIG. 9 illustrates the normal condition of a locating pin employed in the apparatus embodying the invention.
Figure 10:
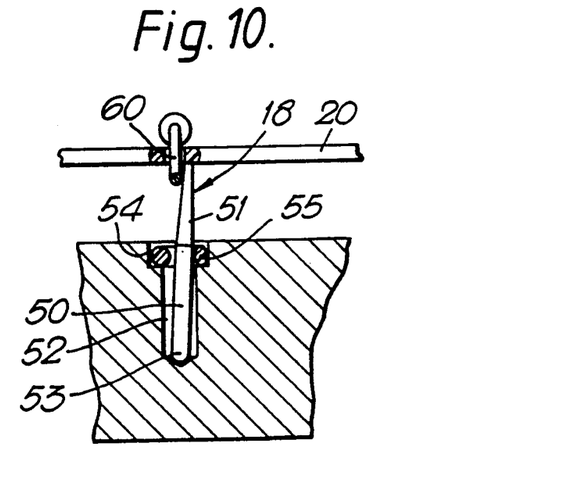
FIG. 10 shows the locating pin in a pivotally displaced position as a result of encountering an obstruction on the lower surface of a printed circuit board.

FIGS. 9 and 10 illustrate a preferred form of the locating pin 18 for determining the length of the cropped leads. As shown in these Figures, the locating pin 18 comprises a cylindrical body 50 formed with an upper tapered end portion 51. The body 50 of the pin is housed in a corresponding blind bore 52 of larger diameter formed in the cutter. A lower end 53 of the pin body 50 is rounded and fits closely in a complementary depression in the base of the bore 52, so that limited pivoting movement of the pin 18 about the end 52 within the bore 52 is possible. The open end of the bore 53 is further enlarged to form an annular seat 54 fitted with a resilient O-ring 55 which resiliently engages an upper end portion of the cylindrical pin body in a normal upright position of the pin 18. The upper end portion 51 of the pin projects from the bore and has a free upper end which is intended to be engaged by the lower surface of the printed circuit board 20.

Such a locating pin 18 enables accurate location of the printed circuit board 20 with respect to the cutters 28, even when the pin 18 encounters a lead 60 of an already installed component. In this case, the pin 18 is simply pivotally displaced to one side of the component lead 60 and engages the board surface next to the lead 60 as shown in FIG. 10.

In another embodiment of the invention (not illustrated), the optical position sensing system 8 is replaced by a light guide and a simple unitary light detector delivering a single output signal indicative of whether or not the detector is illuminated. The light guide conducts light falling on its input end to the light detector which is closely coupled to an output end of the guide.

In operation of this alternative position sensing system, once a printed circuit board hole has been positioned at its pre-programmed location above the cutting means, the circuit board is automatically subjected to a small checking displacement in the X direction, such that the light spot from the hole is swept over the inlet end of the light guide, causing the detector to be subjected to two transitions between light and dark conditions. The output signal of the detector is monitored during this checking displacement of the board and the positions of these two transitions are recorded. The desired corrected X co-ordinate of the circuit board hole is then determined as the mid-point between the positions of the two transitions and the board is positioned accordingly. A corrected Y position co-ordinate is then similarly determined by automatically subjecting the board to a checking displacement in the Y-direction in order finally to position the hole accurately with respect to the optical position sensing system.

We claim:

1. Printed circuit board, assembly apparatus comprising means for supporting a printed circuit board for assembly of components on one side of the board by inserting leads of the components into corresponding holes formed in the circuit board at predetermined locations; cutting means for cropping and crimping the leads of a component projecting from the other side of the board after assembly of the component on the board; and chute means for collecting the ends of the leads severed by the cutting means, the chute means being movable relative to the cutting means to actuate the cutting means to crop and crimp the component leads.

2. Apparatus according to claim 1, in which the cutting means comprises a cutter having a fixed jaw and a movable jaw which is carried on an operating lever having one end pivotally connected to the fixed jaw, the other end of the operating lever carrying a roller which runs on a guide carried by the chute, whereby displacement of the chute pivots the operating lever to close the movable jaw on the fixed jaw.

* * * * *